United States Patent
Huang et al.

(10) Patent No.: US 12,020,929 B2
(45) Date of Patent: Jun. 25, 2024

(54) EPITAXIAL LAYER WITH SUBSTANTIALLY PARALLEL SIDES

(71) Applicant: Intel Corporation, Santa Clara, CA (US)

(72) Inventors: Cheng-Ying Huang, Portland, OR (US); Gilbert Dewey, Beaverton, OR (US); Jack T. Kavalieros, Portland, OR (US); Aaron Lilak, Beaverton, OR (US); Ehren Mannebach, Beaverton, OR (US); Patrick Morrow, Portland, OR (US); Anh Phan, Beaverton, OR (US); Willy Rachmady, Beaverton, OR (US); Hui Jae Yoo, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 1094 days.

(21) Appl. No.: 16/454,568

(22) Filed: Jun. 27, 2019

(65) Prior Publication Data
US 2020/0411315 A1  Dec. 31, 2020

(51) Int. Cl.
*H01L 23/498* (2006.01)
*H01L 21/02* (2006.01)
*H01L 25/065* (2023.01)

(52) U.S. Cl.
CPC .. *H01L 21/02532* (2013.01); *H01L 21/02472* (2013.01); *H01L 23/49827* (2013.01); *H01L 25/0657* (2013.01)

(58) Field of Classification Search
None
See application file for complete search history.

(56) References Cited

U.S. PATENT DOCUMENTS

| 5,349,228 | A | * | 9/1994 | Neudeck | ........... H01L 29/78654 |
| | | | | | 257/365 |
| 10,134,640 | B1 | | 11/2018 | Chiang | |
| 10,304,833 | B1 | * | 5/2019 | Suvarna | ............. H01L 29/0673 |

FOREIGN PATENT DOCUMENTS

WO    WO 2018/169519    9/2018

OTHER PUBLICATIONS

Office Action from European Patent Application No. 20161716.4, dated Jul. 15, 2022, 8 pgs.
Search Report from European Patent Application No. 20161716.4, dated Nov. 18, 2020, 10 pgs.

* cited by examiner

*Primary Examiner* — Jack S Chen
(74) *Attorney, Agent, or Firm* — Schwabe, Williamson & Wyatt P.C.

(57) ABSTRACT

Embodiments herein relate to systems, apparatuses, or processes directed to manufacturing transistors that include a substrate, an epitaxial layer with a first side and a second side opposite the first side, where the first side and the second side of the epitaxial layer are substantially planar, where the second side of the epitaxial layer is substantially parallel to the first side, and where the first side of the epitaxial layer is directly coupled with a side of the substrate. In particular, the epitaxial layer may be adjacent to an oxide layer having a side that is substantially planar, where the second side of the epitaxial layer is adjacent to the side of the oxide layer, and the epitaxial layer was grown and the growth was constrained by the oxide layer.

11 Claims, 9 Drawing Sheets

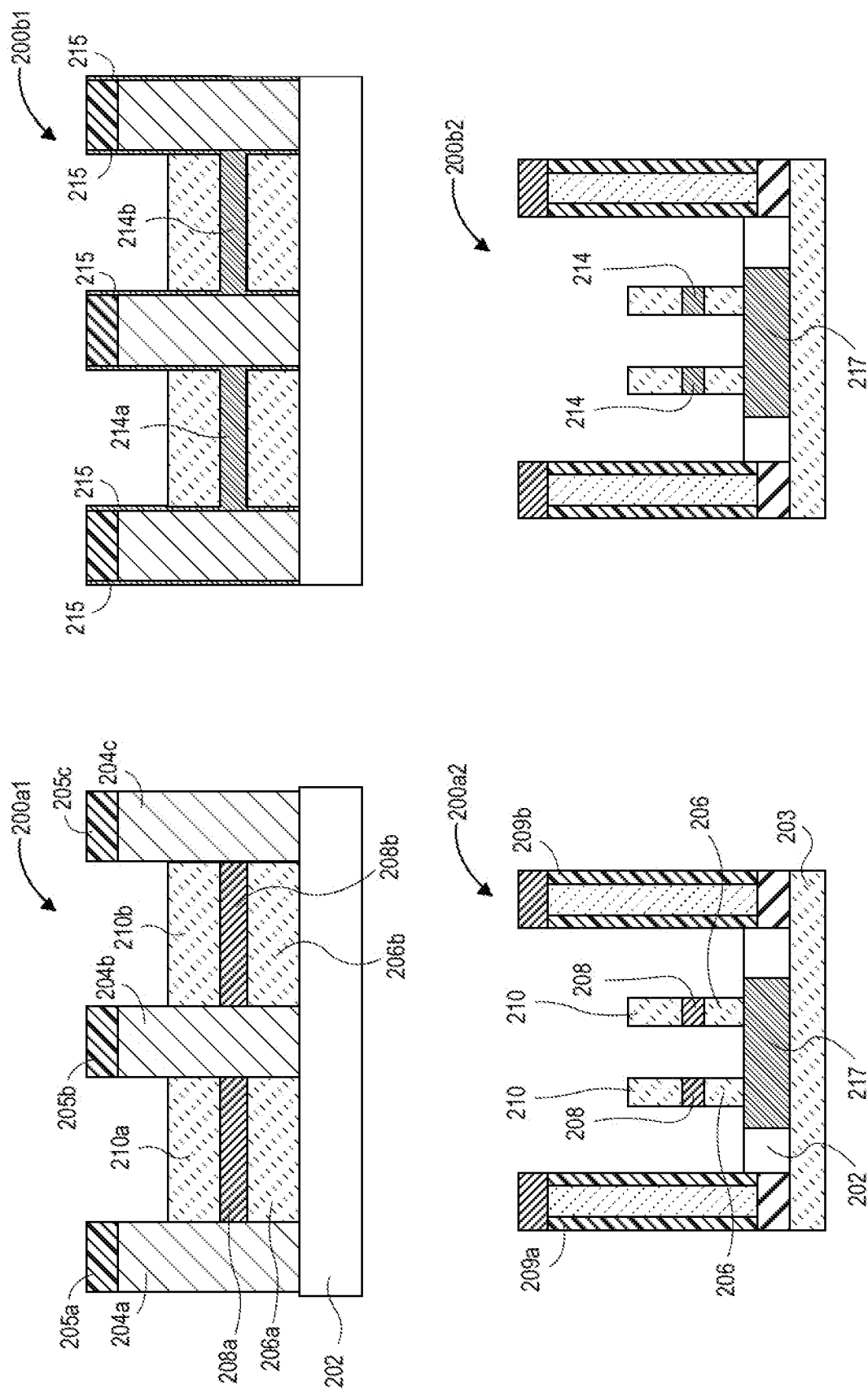

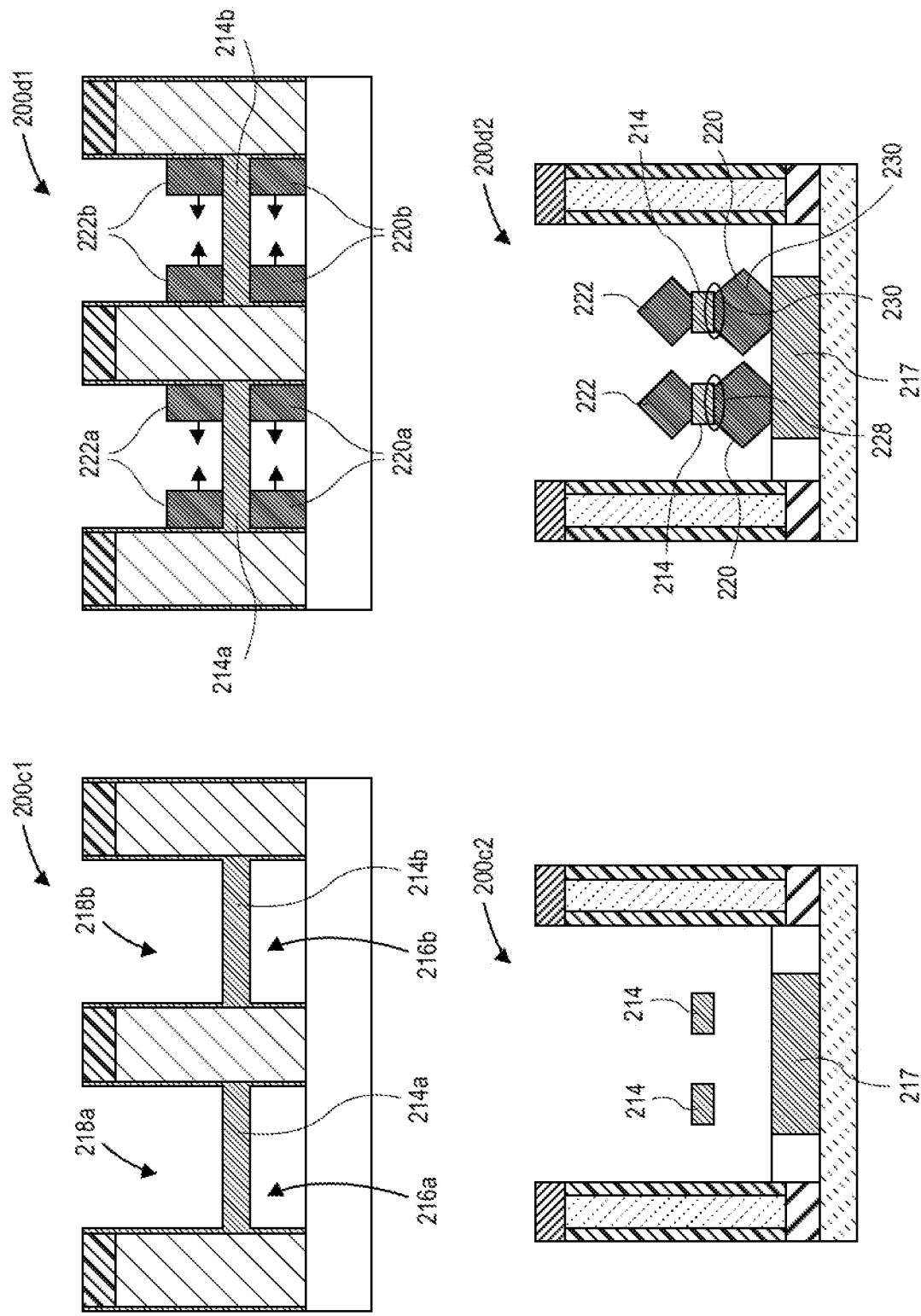

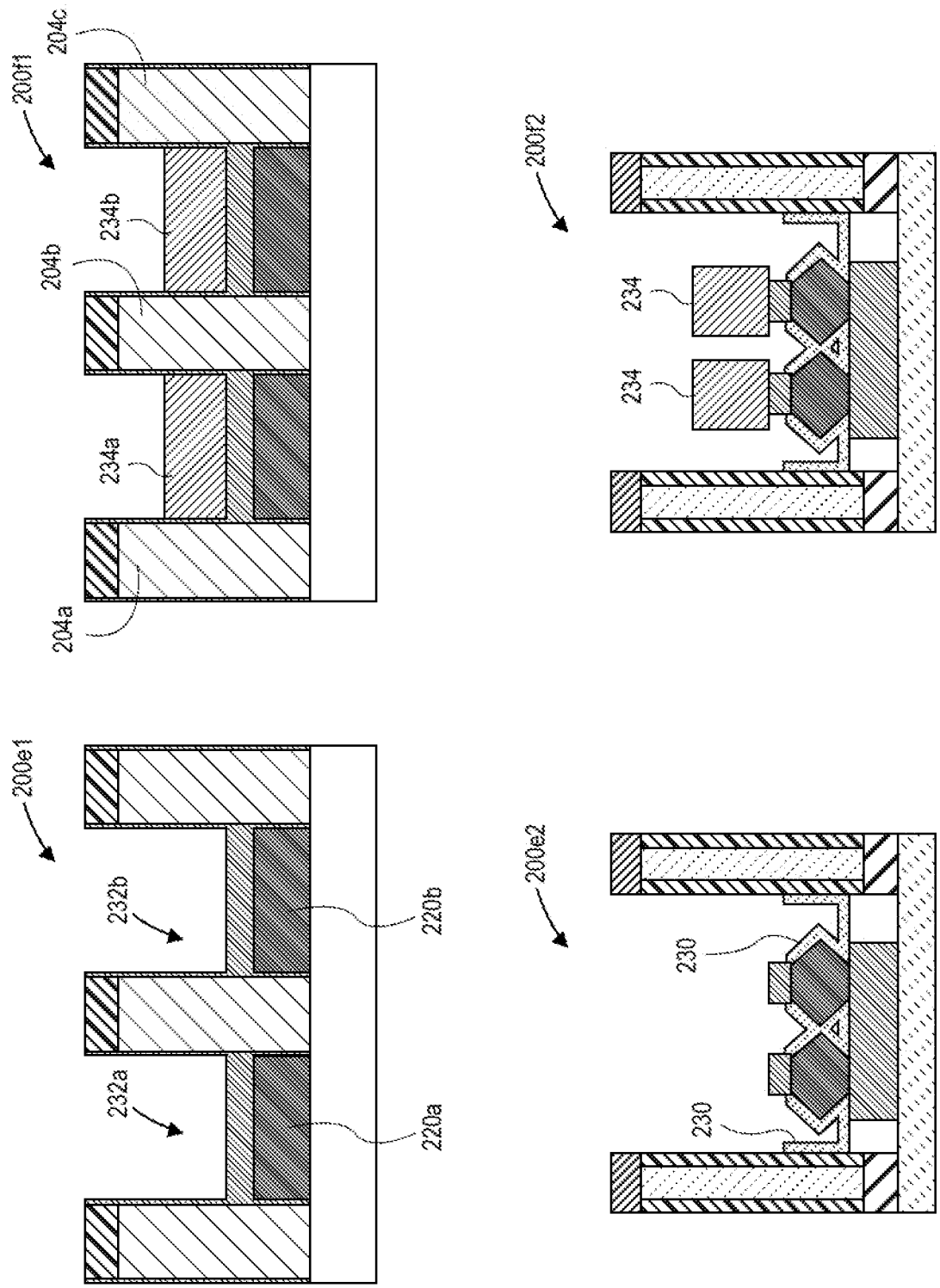

EPITAXIAL LAYER WITH SUBSTANTIALLY PARALLEL SIDES

FIELD

Embodiments of the present disclosure generally relate to the field of transistor manufacturing, and in particular three dimensional (3D) stacked transistors.

BACKGROUND

Continued reduction in end product size of mobile electronic devices such as smart phones and ultrabooks is a driving force for the development of increased transistor density in system components.

BRIEF DESCRIPTION OF THE DRAWINGS

FIGS. 2A-2F illustrate an example of a portion of a transistor manufacturing process using an oxide bridge to constrain epitaxial layer growth, in accordance with embodiments.

DETAILED DESCRIPTION

Figure 1A:
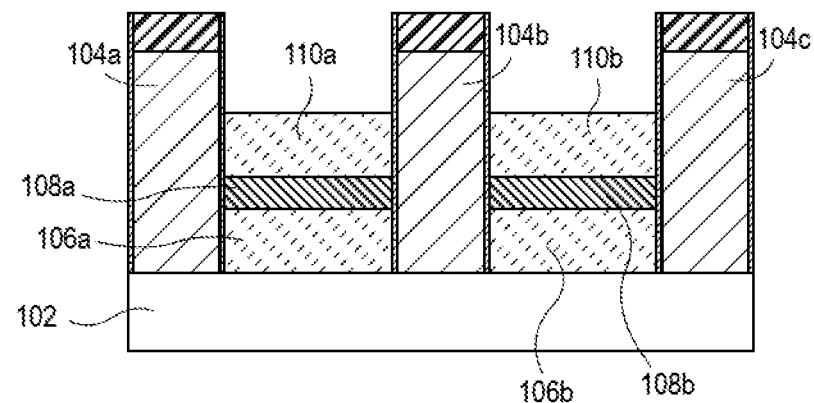
FIGS. 1A-1D illustrate an example of a legacy transistor manufacturing process.

Embodiments of the present disclosure may generally relate to systems, apparatus, and/or processes directed to manufacturing transistors, including stacked transistors, or other components that use and epitaxial layer that has a first side, and a second side opposite the first side where the first side and the second side of the epitaxial layer form substantially parallel planes. In embodiments, the apparatus may include a substrate, and epitaxial layer with a first side and a second side opposite the first side, where the first side of the epitaxial layer is directly coupled with a side of the substrate, and where the second side of the epitaxial layer is coupled with or adjacent to an oxide bridge on a side of the epitaxial layer opposite the substrate, and where the epitaxial layer is grown against the oxide bridge and the oxide bridge causes the side of the epitaxial layer to be constrained and to form a substantially planar surface.

The creation of monolithic 3-D stacked transistors is a potential path to further extend Moore's law beyond 5 nanometer (nm) generations. By stacking transistors directly on top of each other, 3-D complementary metal-oxide-semiconductor (CMOS) architecture enables a smaller cell size (e.g. group of transistor and interconnect structures that provide a Boolean logic function or a storage function), and/or lower resistive-capacitive (RC) delay compared with conventional 2-D CMOS architectures. In legacy sequential 3-D integration, a first metal-oxide-semiconductor (MOS) layer is made, another Si wafer is bonded to the first MOS layer, and the second MOS layer is made separately on top of the bonded wafer. This approach may result in high manufacturing cost because it doubles the front end lithography processes. Furthermore, in legacy implementations, the alignment of top layer to the bottom layer may be difficult and may need to be strictly controlled in order to make necessary interlayer connections.

In contrast, in the legacy shared gate approach, the diffusion and poly can be defined in single lithography step, greatly reducing the lithography cost compared with legacy sequential 3-D integration. In this legacy approach, Si diffusion patterning defines the Si fin, nanowire or nanoribbons, which are the electrical conducting channels. The poly patterning defines the replacement poly gate. The diffusions and poly can be perpendicular to each other. The shared gate approach also self-aligns the top layers to the bottom layers, mitigating the risk of shorted interlayer connections. In this legacy approach, to make shared-gate stacked transistors, however, dual epitaxial (EPI) source/drain (S/D) with opposite doping types needs to be precisely grown on the top channel and bottom channel, respectively. In this legacy approach, stacked transistors have the opposite doping type in dual EPI process. NMOS has n-type doped S/D, and PMOS has p-type doped S/D. N-type doped S/D could be Si doped with P, As, Sb or the combination of the above. P-type doped S/D could be Si or silicon germanium (SiGe) doped with boron (B), aluminum (Al), or gallium (Ga) or in a combination. In this legacy approach, dual EPI S/D process is very difficult to control and can significantly degrade transistor or cell performance if not engineered properly.

Embodiments described herein may include methods and/or techniques to form a self-aligned S/D in 3-D shared-gate stacked transistors. In particular, embodiments include forming an oxide bridge between the two transistor layers and subsequently growing EPI S/D in a confined way. Embodiments may result in a self-aligned S/D growth that is confined by an oxide bridge for 3-D stacked transistors. This confined growth enables shorter interlayer connection and provides reduced interconnect resistance and a lower parasitic capacitance, hence reducing RC delay in 3-D stacked or shared-gate CMOS. Additionally, with a shorter N—P separation distances resulting from the controlled growth, faster operating logic cells may be built.

In embodiments, a stacked EPI S/D may be grown that is self-confined and easily self-aligned to the Si channels by forming a suspension oxide bridge in the S/D regions. The oxide bridge allows self-aligned, and self-confined EPI growth. In embodiments, only one mask may be used during the process, which reduces cost, and allows the top and bottom layers to be aligned by being constructed together.

Other legacy implementations may include implementations where the top channel EPI S/D is grown from the front side, and the bottom channel EPI S/D is grown from the back side. Growing EPI S/D from the backside has strict thermal budget limitation because the front side interconnect, contacts, and high-k metal gate (HKMG) can degrade at high temperature during the bottom S/D growth. In another legacy approach, dual EPI S/D can be grown both from the front side in an unconfined manner. Such legacy approaches may be more similar to traditional CMOS gate last flow, where EPI is grown with the presence of replacement poly dummy gate and the HKMG is filled after EPI deposition and dummy poly gate removal. In addition, these legacy approaches make stacking second layers difficult due to alignment issues with the first layer, resulting in increased cost and lower yields.

In embodiments described herein, the SiGe S/D is grown on the bottom channel (PMOS at the bottom), and then the isolation oxide is deposited to separate PMOS and NMOS. The Si:P is then grown on the top channel (NMOS on the top).

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

Various operations may be described as multiple discrete operations in turn, in a manner that is most helpful in understanding the claimed subject matter. However, the order of description should not be construed as to imply that these operations are necessarily order dependent.

As used herein, the term "module" may refer to, be part of, or include an ASIC, an electronic circuit, a processor (shared, dedicated, or group) and/or memory (shared, dedicated, or group) that execute one or more software or firmware programs, a combinational logic circuit, and/or other suitable components that provide the described functionality.

Various figures herein may depict one or more layers of one or more package assemblies. The layers depicted herein are depicted as examples of relative positions of the layers of the different package assemblies. The layers are depicted for the purposes of explanation, and are not drawn to scale. Therefore, comparative sizes of layers should not be assumed from the figures, and sizes, thicknesses, or dimensions may be assumed for some embodiments only where specifically indicated or discussed.

FIGS. 1A-1D illustrate an example of a legacy transistor manufacturing process.

The legacy process demonstrates a non-confined growth process when dual EPI is grown from the front-side, but not in a confined way. The SiGe S/D is grown on the bottom channel (PMOS in the bottom), and then the isolation oxide is deposited to separate PMOS and NMOS. The Si:P is then grown on the top channel (NMOS on the top).

FIG. 1A illustrates a post gate patterning action that includes three poly gates 104a, 104b, 104c that are coupled with a shallow trench isolation (STI) oxide layer 102 if a bulk Si wafer is used, or can be a bonding oxide if a silicon on insulator (SOI) wafer is used. The poly gates 104a, 104b, 104c may be considered as dummy gates that may be subsequently removed later in the process. A first Si layer 106a, 106b, is coupled with a STI oxide layer 102, and a SiGe layer 108a, 108b is coupled with the first Si layer 106a, 106b. A second Si layer 110a, 110b is applied to the SiGe layer 108a, 108b.

Figure 1B:
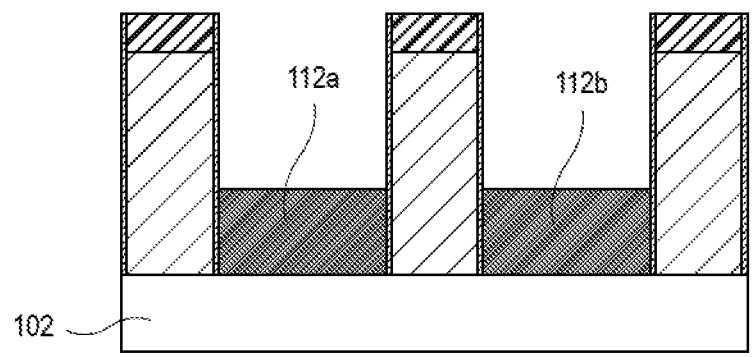

FIG. 1B illustrates a subsequent action where the first Si layer 106a, 106b, SiGe layer 108a, 108b, and second Si layer 110a, 110b are stripped away, and a SiGe layer 112a, 112b is grown on the STI oxide layer 102. The SiGe layer 112a, 112b may also be referred to as a P-EPI layer that is grown in a bottom channel. Because the SiGe layer 112a, 112b is grown without any constraints, it grows omnidirectionally including laterally to form a crystalline facet and also grows vertically, perpendicular to the STI oxide layer 102. As discussed below, this limits the space of the NMOS to PMOS separation and limits the minimum separation distance between the top transistor layer and the bottom transistor layer.

Figure 1C:
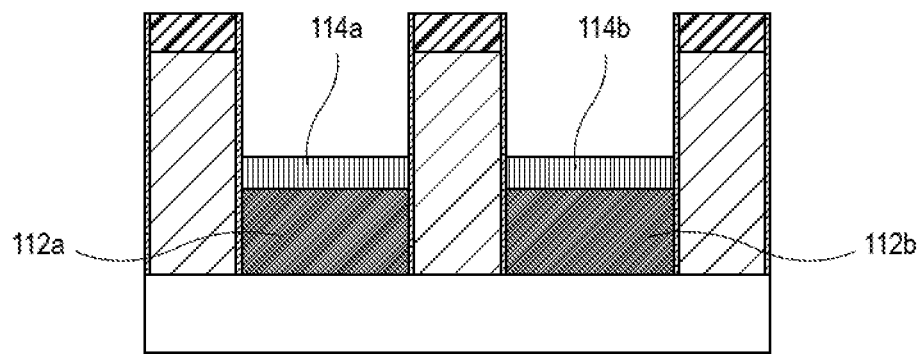

FIG. 1C illustrates a subsequent action where an isolation oxide layer 114a, 114b is placed on and around the SiGe layer 112a, 112b after the SiGe layer has been fully grown.

Figure 1D:
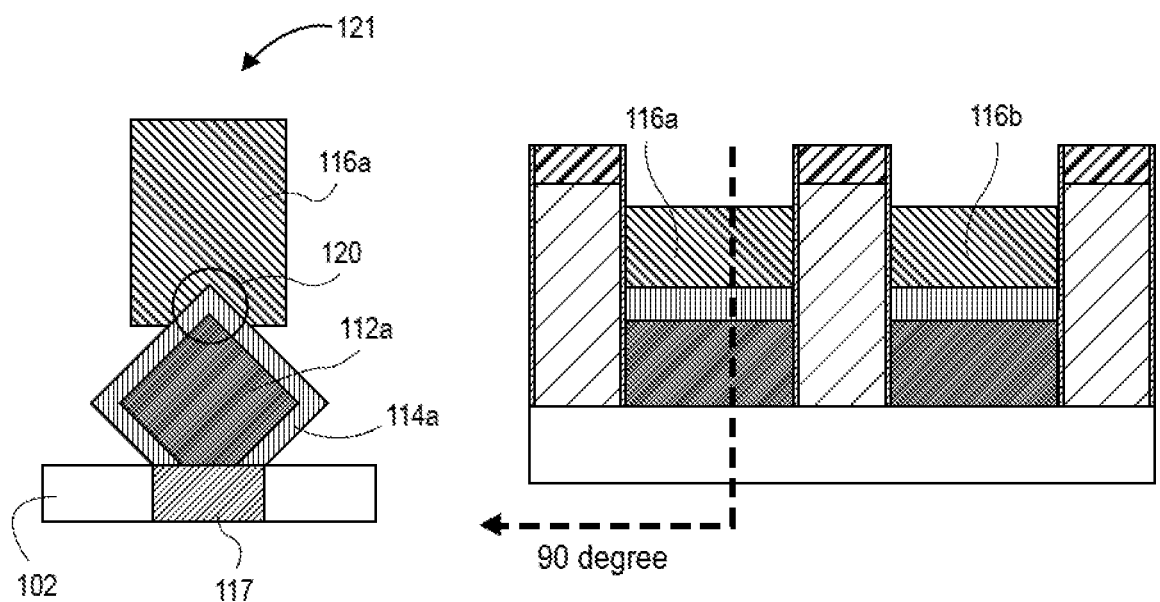

FIG. 1D illustrates a subsequent action where a Si layer 116a, 116b is applied on the isolation oxide layer 114a, 114b. Diagram 121 shows a cross-section at the cut line where a transistor component is formed with the silicon layer 116a, which may be referred to as an N-EPI layer, that is coupled with the isolation oxide layer 114a, that is coupled with the SiGe layer 112a, that is coupled with an M layer 117. In embodiments, the M layer 117 may be an insulator, Si, or backend interconnect. Due to the SiGe layer's 112a unconstrained growth, at area 120 it can be readily seen that there is not a broad area of contact for either the isolation oxide layer 114a or the SiGe layer 112a. The more the SiGe layer 112a (which may be referred to as the bottom EPI) grows upward, the less the space for the NMOS-to-PMOS separation. This would eventually limit the minimum separation distance between top transistor layer and the bottom transistor layer. With increasing N—P separation (i.e. SiGe thickness or isolation oxide thickness), the resistance of the interlayer connection and the parasitic capacitance both increase, thus slowing down the speed of logic cells.

As shown for the legacy technique, the N-EPI is grown on the top Si fins, and the P-EPI is grown on the bottom Si fins. Given the tighter space in S/D regions, to grow N-EPI and P-EPI self-aligned to the corresponding channels is difficult.

FIGS. 2A-2F illustrate an example of a portion of a transistor manufacturing process using an oxide bridge to constrain epitaxial layer growth, in accordance with embodiments. It is important to note that the epitaxial layer may be a Si layer or a SiGe layer.

FIG. 2A includes diagram 200a1 that illustrates a poly etch to form a replacement gate. Note that there is a top Si temporary layer 210a, 210b and a bottom Si temporary layer 206a, 206b which are separated by SiGe layer 208a, 208b. The SiGe layer 208a, 208b may be between approximately 10 nm to 100 nm in thickness and will be removed in the downstream actions. The thickness of SiGe layer will determine the separation distance between NMOS and PMOS. In this example, the NMOS will eventually correspond to the top Si temporary layer 210a, 210b and PMOS will eventually correspond to the bottom Si temporary layer 206a, 206b. The post gate patterning action includes three poly gates 204a, 204b, 204c that are coupled with a STI oxide 202. The poly gates 204a, 204b, 204c may be considered as dummy gates that will be subsequently removed later in the process. A first Si temporary layer 206a, 206b, is coupled with or adjacent to the STI oxide 202, and the SiGe layer 208a, 208b is coupled with or adjacent to the first Si temporary layer 206a, 206b. A second Si temporary layer 210a, 210b is applied to the SiGe layer 208a, 208b. In embodiments, a nitride hardmask (NHM) layer 205a, 205b, 205c may be coupled with the poly gates 204a, 204b, 204c, and may be used to define and etch a replacement poly gate (not shown). Subsequently, the NHM and poly gates may be removed and filled with a high-k metal gate.

Diagram 200a2 illustrates a side view that includes two stacks of Si 210 on SiGe 208 on Si layer 206 that may be positioned between two segmentation walls (SAWs) 209a, 209b. As shown, the stacks may be coupled to an STI 202, which may be further coupled with another Si layer 203, which may be an interconnect layer. In embodiments, the Si layer 202 may include an M layer 217, which may be similar to M layer 117, which may be an insulator, Si, or backend interconnect, of FIG. 1, and may be coupled with or embedded into the Si layer 206.

FIG. 2B includes diagram 200b1 that illustrates the result of a SiGe etch, spacer deposit, and spacer etch actions. First, a selective removal of SiGe is performed without removing Si. This may be performed by etching the SiGe layer 208a, 208b of FIG. 2A. The SiGe etch can be a wet etch, a plasma etch, or a vapor phase etch. This removal will release top fins from the bottom fins on the S/D regions.

Second, a spacer material 214a, 214b may be deposited. Spacer materials may include, for example, an oxide, a nitride, or other suitable material. In embodiments, the spacer material 214a, 214b may be grown in a conformal manner by atomic layer deposition (ALD) or chemical vapor deposition (CVD). In embodiments, due to the small area between the second Si temporary layer 210a, 210b and the first Si temporary layer 206a, 206b of FIG. 2A, the spacer material 214a, 214b can merge and completely fill the area. During spacer dry etch, the gate spacer 215 can form at the sidewall of the gate and spacer material 214a, 214b will still be intact.

Third, a spacer etch may be performed to form a gate spacer 215 (as shown on the gate side wall 204a, 204b, 204c). The spacer material 214a, 214b underneath the top Si fins is protected and serves as an N—P separation oxide. As a result, an oxide layer 214a, 214b that will serve as an oxide bridge has now replaced the SiGe 208a, 208b layer of diagram 200a1. In addition, gate spacer 215 has coated at least part of the poly gates 204a, 204b, 204c. Diagram 200b2 shows the oxide layer 214 replacing the SiGe layer 208 of diagram 200a2.

FIG. 2C includes diagram 200c1 that illustrates the formation of an oxide bridge by selectively etching silicon. The first Si temporary layer 206a, 210b and the second Si temporary layer 210a, 210b of FIG. 2A are selectively etched away using a chemical etching. As a result, cavities 216a, 216b, 218a, 218b are created, leaving only the oxide bridge 214a, 214b. The oxide bridge 214a, 214b is suspended in the S/D regions and anchored by the poly replacement gates 204a, 204b, 204c. The oxide bridge will subsequently enable self-aligned and self-confined S/D regrowth as discussed below. Diagram 200c2 shows a cross section of the oxide bridges 214.

It should be noted that there may be other ways to make the similar kinds of oxide bridges that are not limited to the example described above. For example, an oxidation technique may be used to form an oxide bridge by selectively oxidizing a SiGe separation layer over Si. In another example, a SOI wafer may be used to thin buried oxide as a suspension oxide bridge, or a SOI wafer may be used to make stack transistors and its thin bonding oxide can serve as an oxide bridge. Additionally, a catalytic oxidation or oxygen implant technique may be used to form an oxide bridge.

FIG. 2D includes diagram 200d1 that illustrates the formation of a SiGe EPI 222a, 222b that is grown in the top channel and a SiGe EPI 220a, 220b that is grown in the bottom channel. Due to the presence of the suspended oxide bridge 214a, 214b, the bottom SiGe EPI 220a, 220b is not allowed to grow upward. It can grow laterally to merge with the other EPI front from the gate or fin next to it; however, it cannot grow upward to encroach the space of the top EPI S/D. This may be referred to as self-confined EPI growth confined by the oxide bridge 214a, 214b. The SiGe EPI 222a, 222b are sacrificial and will be removed later.

Diagram 200d2 illustrates the growth of the SiGe 222 in the top channel and the growth of the SiGe 220 in the bottom channel. Note the interfaces 228, 230 between the SiGe 220 in the bottom channel and the oxide bridge 214. The interfaces 228, 230 are flat due to growth confined by the oxide bridge 214, in contrast to the sharp/irregular interface 120 of FIG. 1D due to unconfined growth. Note that in the flow here the top sacrificial SiGe 222 will be removed subsequently in the process. In another approach, the top channel may be sealed by an oxide spacer (not shown) and bottom SiGe EPI 220a, 220b may be grown solely on the bottom fins.

FIG. 2E includes diagram 200e2 that illustrates the deposition of an oxide 230 on the top EPI S/D 222a, 222b and the bottom EPI S/D SiGe 220a, 220b. Subsequently, the oxide (not shown) on the SiGe 222a, 222b is removed, so that the oxide 230 only covers the SiGe 220a, 220b to protect it from the subsequent SiGe etch process. After the oxide 230 is deposited, the top EPI SiGe 222a, 222b can be etched away. Diagram 200e1 illustrates the result of the etch process to remove the sacrificial SiGe 222a, 222b, resulting in cavity 232a, 232b. Note the suspension oxide bridge 214a, 214b is still in place and will serve subsequently as an N—P separation layer.

FIG. 2F includes diagram 200f1 that illustrates a silicon layer 234a, 234b that is newly grown on top of the oxide bridge 214a, 214b. The silicon layer 234a, 234b is grown laterally from the top channels, which are embedded in the poly gate 204a, 204b, 204c, and then merge to form a S/D. The silicon layer 234a, 234b may serve as an N-type S/D and the SiGe layer 220a, 220b may serve as a P-type S/D of the transistor. Diagram 200f2 shows a side view where the silicon layer 234 is grown on the top channel (embedded in the poly gate 204a, 204b, 204c) and will be tangent to the top of the oxide layer 214 as an EPI layer. In embodiments, the silicon layer 234 may be referred to as grown on the top fins.

Figure 3:
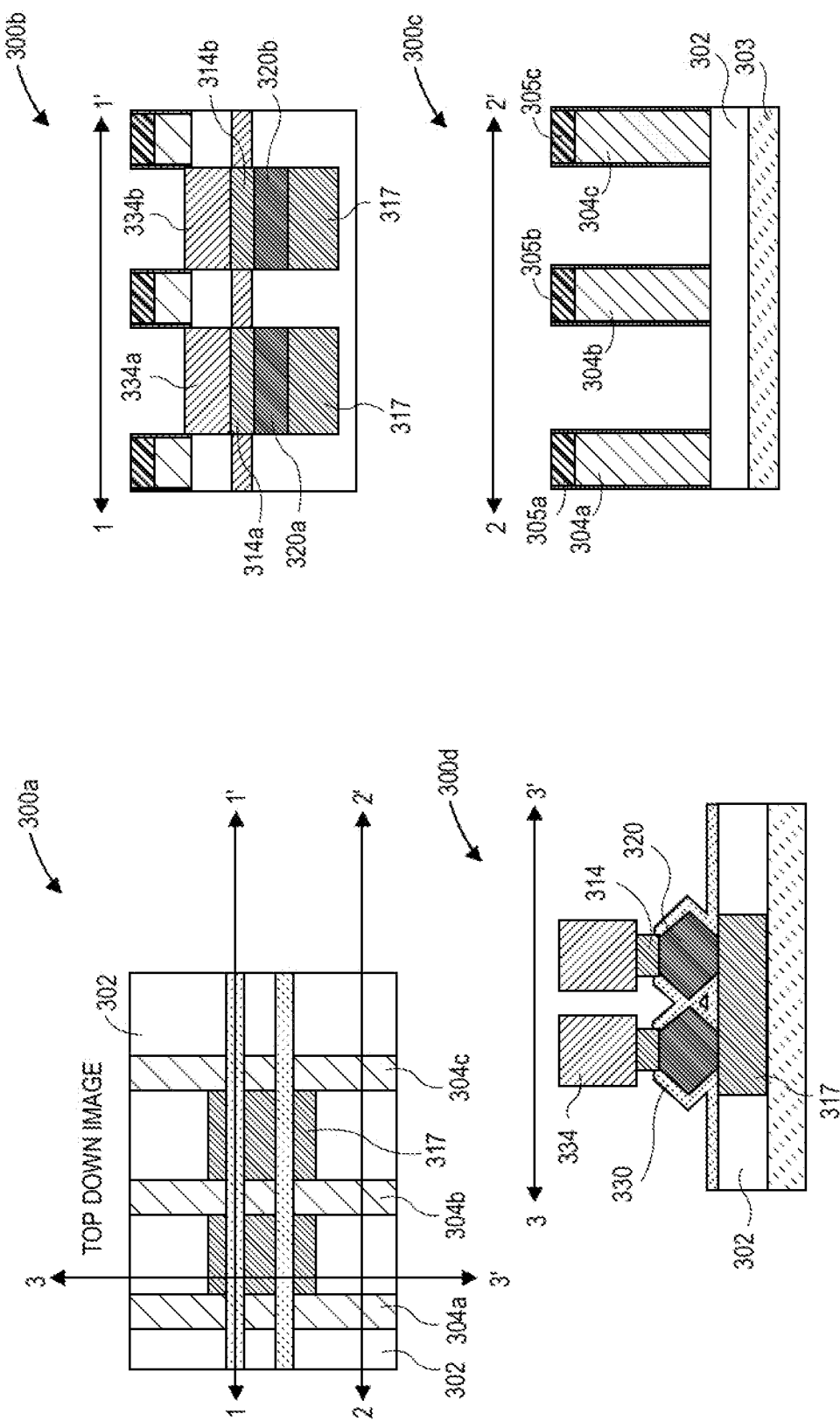
FIG. 3 illustrates cross-sections of a transistor device manufactured using techniques described herein, in accordance with embodiments.

FIG. 3 illustrates cross-sections of a transistor device manufactured using techniques described herein, in accordance with embodiments. Diagram 300a shows a top-down view of a transistor device with cross-section 1-1' corresponding to diagram 300b, cross-section 2-2' corresponding to diagram 300c, and cross-section 3-3' corresponding to diagram 300d.

Diagram 300a shows a STI oxide 302, poly gates 304a, 304b, 304c, and M layer 317, which may be similar, respectively, to STI oxide 202, poly gates 204a, 204b, 204c, and M layer 217 of FIG. 2A.

Diagram 300b shows a profile of cross-section 1-1' of diagram 300a, that includes silicon layers 334a, 334b, which may be similar to silicon layers 234a, 234b of FIG. 2F, position on top of an oxide bridges 314a, 314b, which may be similar to oxide bridge 214 of FIG. 2D. The oxide bridges 314a, 314b are on top of a silicon layer 320a, 320b, which may be similar to silicon layer 220 of FIG. 2D. The silicon layer 320a, 320b are epitaxial layers grown where the oxide bridges 314a, 314b limit the growth of the silicon layer 320a, 320b and form a plane in the silicon layer 320a, 320b surface adjacent to the oxide bridges 314a, 314b. An M layer 317, which may be similar to M layer 217 of FIG. 2A, may be adjacent to the silicon layer 320a, 320b.

Diagram 300c shows poly gates 304a, 304b, 304c on top of a STI oxide 302, which may be similar to Si layer 202 of FIG. 2A, which is also coupled with a Si layer 303. As shown, a NHM layer 305a, 305b, 305c may be coupled with the poly gates 304a, 304b, 304c.

Diagram 300d shows a top silicon layer 334, which may be similar to silicon layer 334a, 334b, coupled with oxide bridge 314, which may be similar to oxide bridge 314a, 314b, which is coupled to a second silicon layer 320, which may be similar to silicon layer 320a, 320b. An oxide 330, surrounds and provides electrical insulation for a portion of the second silicon layer 320.

Figure 4:
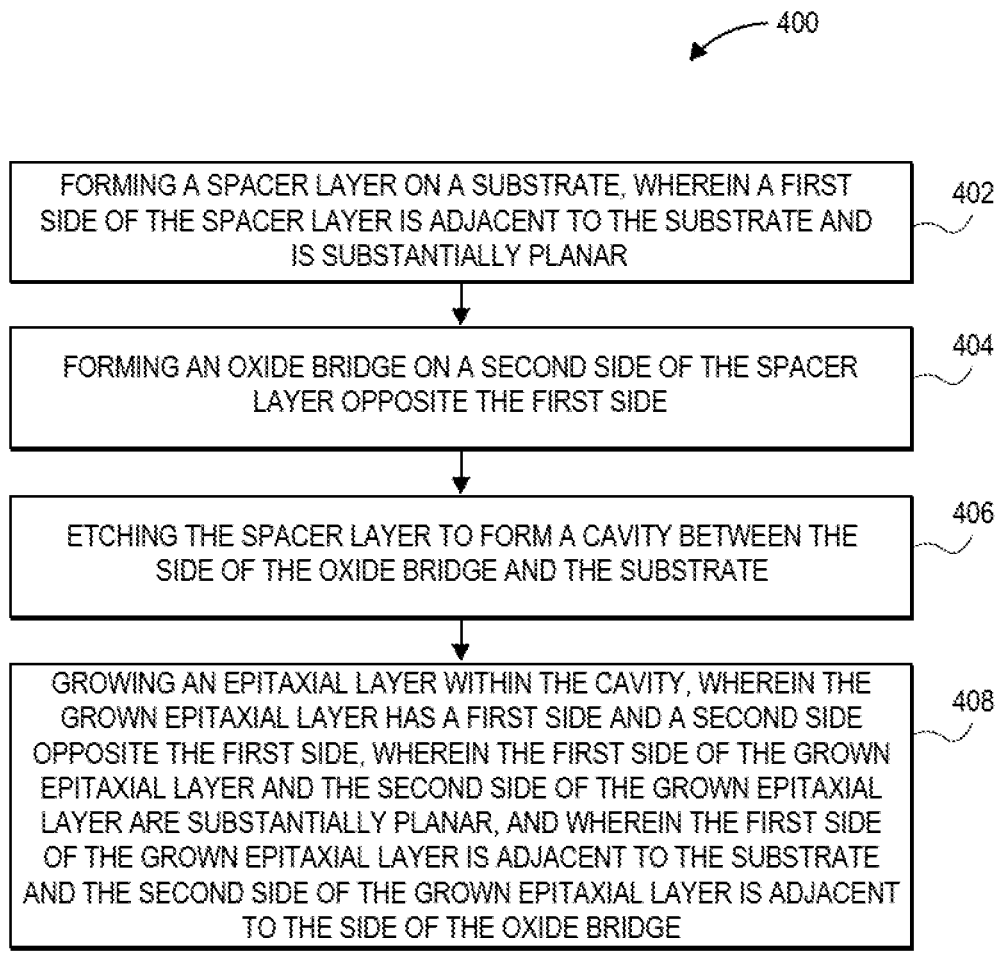
FIG. 4 illustrates an example of a process of using an oxide bridge to constrain epitaxial layer growth, in accordance with embodiments.

FIG. 4 illustrates an example of a process of using an oxide bridge to constrain epitaxial layer growth, in accordance with embodiments. Process 400 may be performed by one or more elements, techniques, or systems that may be found with respect to FIGS. 2A-2F and FIG. 3.

At block 402, the process may include forming a spacer layer on a substrate, wherein a first side of the spacer layer is adjacent to the substrate and is substantially planar. In embodiments, the substrate may be similar to substrate 202 and the spacer layer may be similar to first Si temporary layer 206a, 206b of FIG. 2A.

At block 404, the process may include forming an oxide bridge on a second side of the spacer layer opposite the first side. In embodiments, the oxide bridge may be similar to oxide bridges 214a, 214b of FIG. 2C.

At block 406, the process may include etching the spacer layer to form a cavity between the side of the oxide bridge and the substrate. In embodiments, the oxide bridge may be similar to oxide bridges 214a, 214b of FIGS. 2B-2C. The cavity may be similar to cavity 216a, 216b of FIG. 2C.

At block 408, the process may include growing an epitaxial layer within the cavity, wherein the grown epitaxial layer has a first side and a second side opposite the first side, wherein the first side of the grown epitaxial layer and the second side of the grown epitaxial layer are substantially planar, and wherein the first side of the grown epitaxial layer is adjacent to the substrate and the second side of the grown epitaxial layer is adjacent to the side of the oxide bridge. In embodiments, the grown epitaxial layer may be similar to bottom channel SiGe layers 220a, 220b of FIGS. 2D-2F. The first side of the bottom channel SiGe layer 220 is coupled with or adjacent to the STI 202, and the second side 228, 230 of the SiGe layer 220 is coupled with or adjacent to the oxide bridge 214. In embodiments, as shown in FIG. 2D, the resulting surface shape 228, 230 of the bottom channel SiGe 220 may be planer, may provide a broader area of connection with the oxide bridge 214 and may be substantially parallel to the STI layer 202.

In embodiments, process 400, or variations thereof, when used to create a transistor will result in an N-EPI self-aligned to the top channel, and an P-EPI is self-aligned to the bottom channel. The bottom channel EPI (e.g. bottom channel SiGe layer 220a, 220b of FIG. 2D) cannot grow upward due to the existence of the oxide bridge, and is thus self-confined. This allows tighter N—P separation, reduces interconnection resistance and parasitic capacitance, and enables faster logic cells. In addition, in embodiments, the process is not limited to NMOS-on-PMOS, or PMOS-on-NMOS, CMOS-on-CMOS or a combination of the above. Furthermore, embodiments are not limited to fin-on-fin, nanowire-on-nanowire, nanoribbon-on-nanoribbon, or a combination of the above. In addition, embodiments are not limited to bulk Si wafers, SOI wafers, or any backside interconnect underneath the bottom EPI. In embodiments, the process flow may be modified around the creation and use of an oxide bridge for self-aligned and self-confined S/D regrowth for a 3-D stacked transistor.

Implementations of embodiments of the invention may be formed or carried out on a substrate, such as a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the spirit and scope of the present invention.

A plurality of transistors, such as metal-oxide-semiconductor field-effect transistors (MOSFET or simply MOS transistors), may be fabricated on the substrate. In various implementations of the invention, the MOS transistors may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors. Although the implementations described herein may illustrate only planar transistors, it should be noted that the invention may also be carried out using nonplanar transistors.

Each MOS transistor includes a gate stack formed of at least two layers, a gate dielectric layer and a gate electrode layer. The gate dielectric layer may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer is formed on the gate dielectric layer and may consist of at least one P-type workfunction metal or N-type workfunction metal, depending on whether the transistor is to be a PMOS or an NMOS transistor. In some implementations, the gate electrode layer may consist of a stack of two or more metal layers, where one or more metal layers are workfunction metal layers and at least one metal layer is a fill metal layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a workfunction that is between about 3.9 eV and about 4.2 eV.

In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the invention, the gate electrode may consist of a combination of U-shaped structures and planar, non-U-shaped structures. For example, the gate electrode may consist of one or more U-shaped metal layers formed atop one or more planar, non-U-shaped layers.

In some implementations of the invention, a pair of sidewall spacers may be formed on opposing sides of the gate stack that bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process steps. In an alternate implementation, a plurality of spacer pairs may be used, for instance, two pairs, three pairs, or four pairs of sidewall spacers may be formed on opposing sides of the gate stack.

As is well known in the art, source and drain regions are formed within the substrate adjacent to the gate stack of each MOS transistor. The source and drain regions are generally formed using either an implantation/diffusion process or an etching/deposition process. In the former process, dopants such as boron, aluminum, antimony, phosphorous, or arsenic may be ion-implanted into the substrate to form the source and drain regions. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source and drain regions. In some implementations, the source and drain regions may be fabricated using a silicon alloy such as silicon germanium or silicon carbide. In some implementations the epitaxially deposited silicon alloy may be doped in situ with dopants such as boron, arsenic, or phosphorous. In further embodiments, the source and drain regions may be formed using one or more alternate semiconductor materials such as germanium or a group III-V material or alloy. And in further embodiments, one or more layers of metal and/or metal alloys may be used to form the source and drain regions.

One or more interlayer dielectrics (ILD) are deposited over the MOS transistors. The ILD layers may be formed using dielectric materials known for their applicability in integrated circuit structures, such as low-k dielectric materials. Examples of dielectric materials that may be used include, but are not limited to, silicon dioxide ($SiO_2$), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant.

Figure 5:
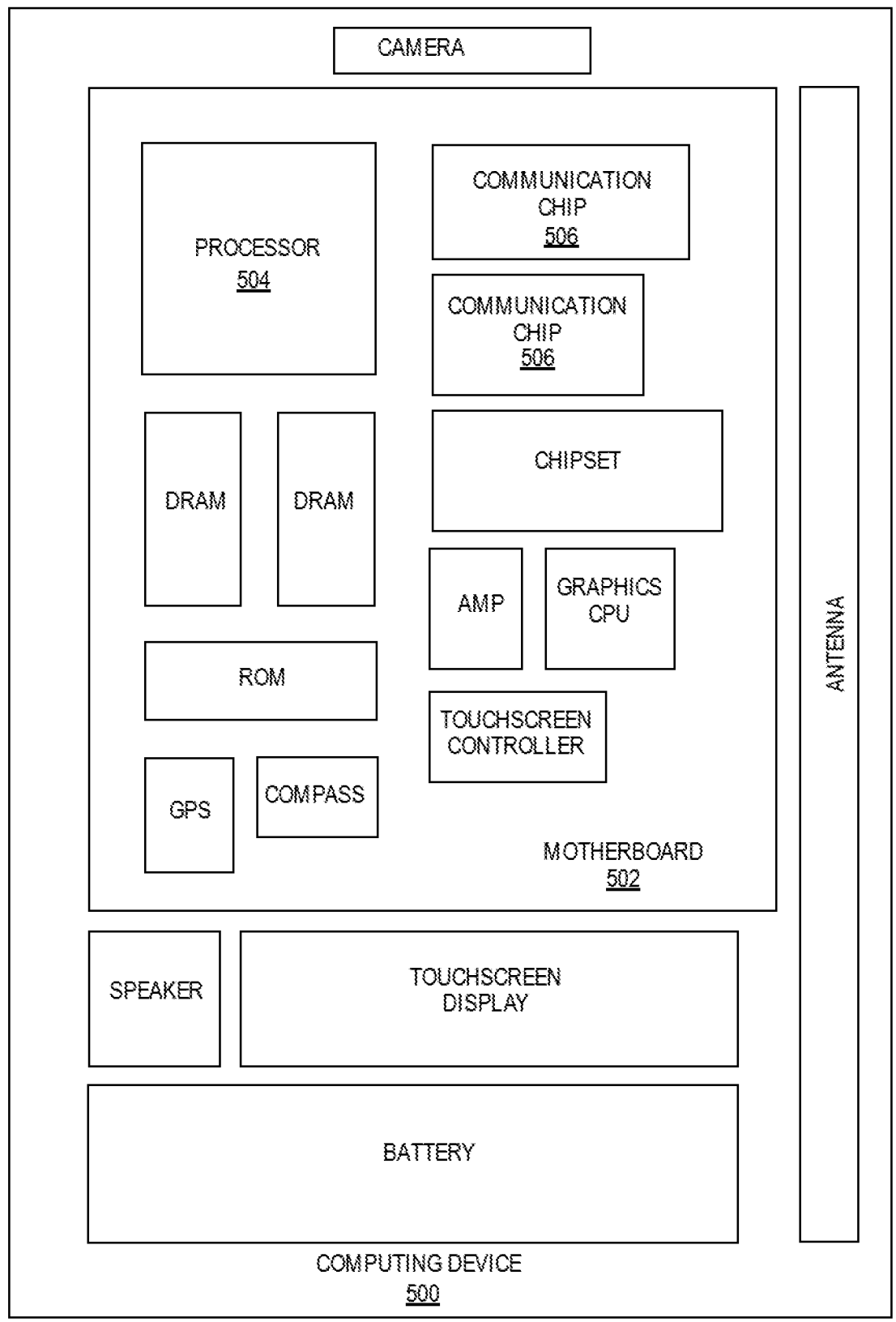
FIG. 5 illustrates a computing device 500 in accordance with one implementation of the invention.

FIG. 5 illustrates a computing device 500 in accordance with one implementation of the invention. The computing device 500 houses a board 502. The board 502 may include a number of components, including but not limited to a processor 504 and at least one communication chip 506. The processor 504 is physically and electrically coupled to the board 502. In some implementations the at least one communication chip 506 is also physically and electrically coupled to the board 502. In further implementations, the communication chip 506 is part of the processor 504.

Depending on its applications, computing device 500 may include other components that may or may not be physically and electrically coupled to the board 502. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 506 enables wireless communications for the transfer of data to and from the computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 506 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 500 may include a plurality of communication chips 506. For instance, a first communication chip 506 may be dedicated to shorter range wireless communications such as Wi-Fi and Bluetooth and a second communication chip 506 may be dedicated to longer range wireless communications such as GPS, EDGE, GPRS, CDMA, WiMAX, LTE, Ev-DO, and others.

The processor 504 of the computing device 500 includes an integrated circuit die packaged within the processor 504. In some implementations of the invention, the integrated circuit die of the processor includes one or more devices, such as MOS-FET transistors built in accordance with implementations of the invention. The term "processor" may refer to any device or portion of a device that processes electronic data from registers and/or memory to transform that electronic data into other electronic data that may be stored in registers and/or memory.

The communication chip 506 also includes an integrated circuit die packaged within the communication chip 506. In accordance with another implementation of the invention, the integrated circuit die of the communication chip includes one or more devices, such as MOS-FET transistors built in accordance with implementations of the invention.

In further implementations, another component housed within the computing device 500 may contain an integrated circuit die that includes one or more devices, such as MOS-FET transistors built in accordance with implementations of the invention.

In various implementations, the computing device 500 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 500 may be any other electronic device that processes data.

Figure 6:
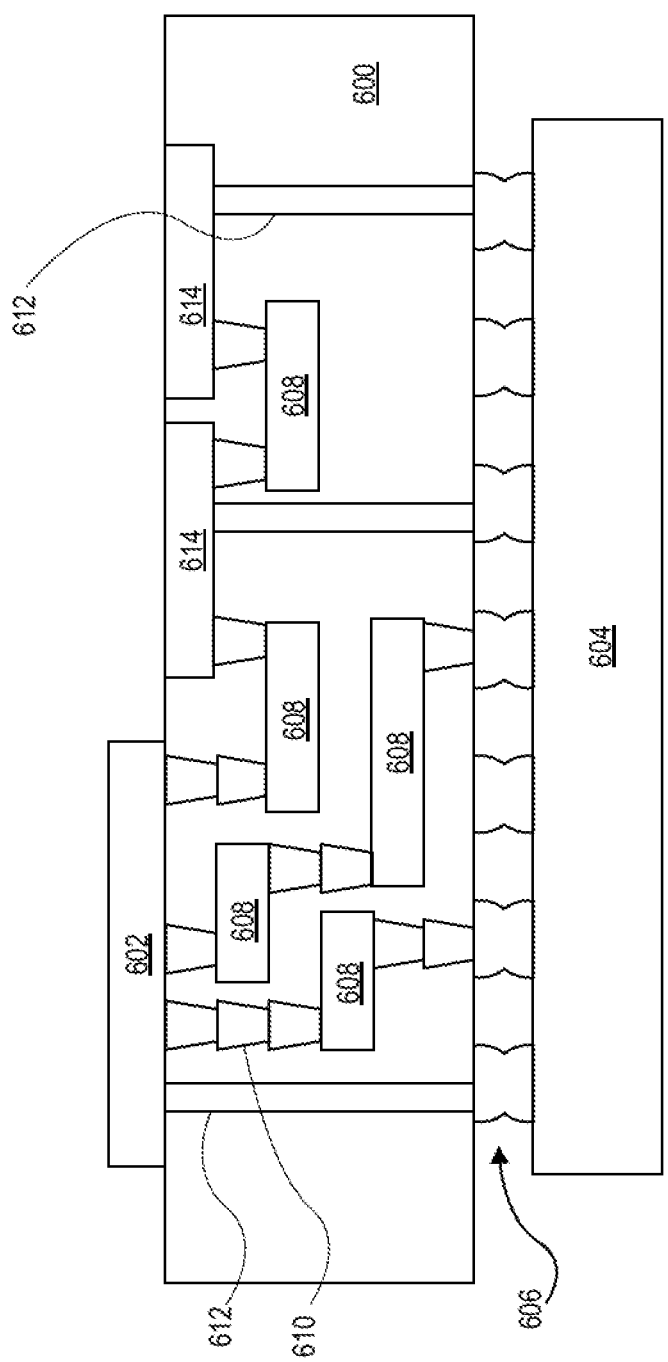
FIG. 6 illustrates an interposer 600 that includes one or more embodiments of the invention.

FIG. 6 illustrates an interposer 600 that includes one or more embodiments of the invention. The interposer 600 is an intervening substrate used to bridge a first substrate 602 to a second substrate 604. The first substrate 602 may be, for instance, an integrated circuit die. The second substrate 604 may be, for instance, a memory module, a computer motherboard, or another integrated circuit die. Generally, the purpose of an interposer 600 is to spread a connection to a wider pitch or to reroute a connection to a different connection. For example, an interposer 600 may couple an integrated circuit die to a ball grid array (BGA) 606 that can subsequently be coupled to the second substrate 604. In some embodiments, the first and second substrates 602/604 are attached to opposing sides of the interposer 600. In other embodiments, the first and second substrates 602/604 are attached to the same side of the interposer 600. And in further embodiments, three or more substrates are interconnected by way of the interposer 600.

The interposer 600 may be formed of an epoxy resin, a fiberglass-reinforced epoxy resin, a ceramic material, or a polymer material such as polyimide. In further implementations, the interposer 600 may be formed of alternate rigid or flexible materials that may include the same materials described above for use in a semiconductor substrate, such as silicon, germanium, and other group III-V and group IV materials.

The interposer 600 may include metal interconnects 608 and vias 610, including but not limited to through-silicon vias (TSVs) 612. The interposer 600 may further include embedded devices 614, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 600. In accordance with embodiments of the invention, apparatuses or processes disclosed herein may be used in the fabrication of interposer 600.

EXAMPLES

The following paragraphs describe examples of various embodiments.

Example 1 is an apparatus comprising: a substrate; an epitaxial layer with a first side and a second side opposite the first side; wherein the first side and the second side of the epitaxial layer are substantially planar; wherein the second side of the epitaxial layer is substantially parallel to the first side; and wherein the first side of the epitaxial layer is directly coupled with a side of the substrate.

Example 2 may include the apparatus of example 1, wherein the epitaxial layer is a grown silicon germanium (SiGe) layer or a grown silicon (Si) layer.

Example 3 may include the apparatus of example 1, wherein two or more sides of the epitaxial layer are at least partially coated in an isolation oxide.

Example 4 may include the apparatus of example 1, further comprising an oxide layer having a side that is substantially planar; and wherein the second side of the epitaxial layer is adjacent to the side of the oxide layer.

Example 5 may include the apparatus of example 4, wherein the epitaxial layer is a grown layer between the side of the substrate and the side of the oxide layer.

Example 6 may include the apparatus of example 4, wherein the side of the oxide layer is a first side, and the oxide layer has a second side opposite the first side, and wherein the second side of the oxide layer is directly coupled with a second layer.

Example 7 may include the apparatus of any one of examples 1-6, wherein the apparatus is a portion of a transistor with the epitaxial layer is either an N-type or a P-type, the second layer is either an N-type or a P-type, and the oxide layer is an electrical separation layer.

Example 8 is a method comprising: forming a spacer layer on a substrate, wherein a first side of the spacer layer is adjacent to the substrate and is substantially planar; forming an oxide bridge on a second side of the spacer layer opposite the first side; etching the spacer layer to form a cavity between the side of the oxide bridge and the substrate; and growing an epitaxial layer within the cavity, wherein the grown epitaxial layer has a first side and a second side opposite the first side, wherein the first side of the grown epitaxial layer and the second side of the grown epitaxial layer are substantially planar, and wherein the first side of the grown epitaxial layer is adjacent to the substrate and the second side of the grown epitaxial layer is adjacent to the side of the oxide bridge.

Example 9 may include the method of example 8, wherein a side of the oxide bridge adjacent to the second side of the spacer layer is substantially planar and substantially parallel to the substrate.

Example 10 may include the method of example 8, wherein the spacer layer is a silicon (Si) spacer layer.

Example 11 may include the method of example 8, wherein forming an oxide bridge on the second side of the spacer layer further includes applying an oxide layer on the second side of the spacer layer.

Example 12 may include the method of example 8, wherein growing an epitaxial layer within the cavity further includes growing the epitaxial layer using a seed.

Example 13 may include the method of any one of examples 8-12, wherein the side of the oxide bridge is a first side; and further including: depositing another layer on a second side of the oxide bridge opposite the first side, wherein the deposited another layer, the oxide bridge, and the epitaxial layer form a portion of a transistor.

Example 14 may include the method of example 8, wherein the substrate is a shallow trench isolation (STI) oxide layer.

Example 15 may be a system comprising: an interconnect layer; a transistor coupled with the interconnect layer, the transistor including: a substrate; an epitaxial layer with a first side and a second side opposite the first side; wherein the first side and the second side of the epitaxial layer are substantially planar; wherein the second side of the epitaxial layer is substantially parallel to the first side; and wherein the first side of the epitaxial layer is directly coupled with a side of the substrate.

Example 16 may include the system of example 15, wherein the epitaxial layer is a grown silicon germanium (SiGe) layer or a grown silicon (Si) layer.

Example 17 may include the system of example 15, wherein two or more sides of the epitaxial layer are at least partially coated in an isolation oxide.

Example 18 may include the system of example 17, further comprising an oxide layer having a side that is substantially planar; and wherein the second side of the epitaxial layer is directly coupled with the side of the oxide layer.

Example 19 may include the system of example 18, wherein the epitaxial layer is grown between the side of the substrate and the side of the oxide layer.

Example 20 may include the system of any one of examples 15-19, wherein the side of the oxide layer is a first side, and the oxide layer has a second side opposite the first side, wherein the second side of the oxide layer is directly coupled with a second layer, and wherein the epitaxial layer is either an N-type or a P-type, the second layer is either an N-type or a P-type, and the oxide layer is an electrical separation layer.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated embodiments, including what is described in the Abstract, is not intended to be exhaustive or to limit embodiments to the precise forms disclosed. While specific embodiments are described herein for illustrative purposes, various equivalent modifications are possible within the scope of the embodiments, as those skilled in the relevant art will recognize.

These modifications may be made to the embodiments in light of the above detailed description. The terms used in the following claims should not be construed to limit the embodiments to the specific implementations disclosed in the specification and the claims. Rather, the scope of the invention is to be determined entirely by the following claims, which are to be construed in accordance with established doctrines of claim interpretation.

What is claimed is:

1. An apparatus comprising:
   a substrate;
   an epitaxial layer with a first side and a second side opposite the first side;
   wherein the first side and the second side of the epitaxial layer are substantially planar;
   wherein the second side of the epitaxial layer is substantially parallel to the first side;
   wherein the first side of the epitaxial layer is directly coupled with a side of the substrate;
   a first oxide layer having a first side and a second side opposite the first side, wherein the first side of the first oxide layer is on the second side of the epitaxial layer, wherein a first width of the epitaxial layer at an uppermost side of the epitaxial layer adjacent to the first side of the first oxide layer is less than a second width of the epitaxial layer located between the first side and the second side of the epitaxial layer;
   a silicon layer on the second side of the first oxide layer; and
   a second oxide layer on an edge of the epitaxial layer, wherein the second oxide layer extends from the first side of the epitaxial layer to the second side of the epitaxial layer, and wherein the second oxide layer is non-planar.

2. The apparatus of claim 1, wherein the epitaxial layer is a grown silicon germanium (SiGe) layer or a grown silicon (Si) layer.

3. The apparatus of claim 1, wherein the epitaxial layer is a grown layer between the side of the substrate and the first side of the first oxide layer.

4. The apparatus of claim 1, wherein the second side of the first oxide layer is directly coupled with the silicon layer.

5. The apparatus of claim 4, wherein the apparatus is a portion of a transistor, wherein the epitaxial layer is either an N-type or a P-type, wherein the silicon layer is either an N-type or a P-type, and wherein the first oxide layer is an electrical separation layer.

6. A system comprising:
   an interconnect layer;
   a transistor coupled with the interconnect layer, the transistor including:
   a substrate;
   an epitaxial layer with a first side and a second side opposite the first side;
   wherein the first side and the second side of the epitaxial layer are substantially planar;
   wherein the second side of the epitaxial layer is substantially parallel to the first side;
   wherein the first side of the epitaxial layer is directly coupled with a side of the substrate;
   a first oxide layer with a first side and a second side opposite the first side, wherein the first side of the first oxide layer is on the second side of the epitaxial layer, wherein a first width of the epitaxial layer at an uppermost side of the epitaxial layer adjacent to the first side of the first oxide layer is less than a second width of the epitaxial layer located between the first side and the second side of the epitaxial layer;
   a silicon layer on the second side of the first oxide layer; and
   a second oxide layer on an edge of the epitaxial layer, wherein the second oxide layer extends from the first side of the epitaxial layer to the second side of the epitaxial layer, and wherein the second oxide layer is non-planar.

7. The system of claim 6, wherein the epitaxial layer is a grown silicon germanium (SiGe) layer or a grown silicon (Si) layer.

8. The system of claim 6, wherein two or more sides of the epitaxial layer are at least partially coated in an isolation oxide.

9. The system of claim 6,
wherein the second side of the epitaxial layer is directly coupled with the first side of the first oxide layer.

10. The system of claim 6, wherein the epitaxial layer is grown between the side of the substrate and the first side of the first oxide layer.

11. The system of claim 6, wherein the second side of the first oxide layer is directly coupled with the silicon layer, and wherein the epitaxial layer is either an N-type or a P-type, the silicon layer is either an N-type or a P-type, and the first oxide layer is an electrical separation layer.

\* \* \* \* \*